US010039218B2

(12) United States Patent
Kubota et al.

(10) Patent No.: US 10,039,218 B2
(45) Date of Patent: Jul. 31, 2018

(54) ELECTRONIC CIRCUIT COMPONENT MOUNTING SYSTEM

(71) Applicant: FUJI MACHINE MFG. CO., LTD., Chiryu (JP)

(72) Inventors: Tomokatsu Kubota, Anjyo (JP); Junichi Suzuki, Toyoake (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 236 days.

(21) Appl. No.: 14/894,444

(22) PCT Filed: Aug. 20, 2013

(86) PCT No.: PCT/JP2013/072145
§ 371 (c)(1),
(2) Date: Nov. 27, 2015

(87) PCT Pub. No.: WO2014/192168
PCT Pub. Date: Dec. 4, 2014

(65) Prior Publication Data
US 2016/0128246 A1 May 5, 2016

(30) Foreign Application Priority Data

May 27, 2013 (JP) .................................. 2013-123162

(51) Int. Cl.
*B23P 19/00* (2006.01)
*H05K 13/04* (2006.01)
(Continued)

(52) U.S. Cl.
CPC ......... *H05K 13/04* (2013.01); *H05K 13/0069* (2013.01); *H05K 13/02* (2013.01);
(Continued)

(58) Field of Classification Search
CPC .. H05K 13/0069; H05K 13/02; H05K 13/028; H05K 13/0404; H05K 13/043; H05K 3/306
See application file for complete search history.

(56) References Cited

U.S. PATENT DOCUMENTS 5,105,532 A * 4/1992 Fritsch ............... H05K 13/0069
29/712
5,649,356 A 7/1997 Gieskes
(Continued)

FOREIGN PATENT DOCUMENTS

JP 1992-196298 A 7/1992
JP 1993-304052 A 11/1993
(Continued)

OTHER PUBLICATIONS

Extended European Search Report dated Dec. 16, 2016 in Patent Application No. 13885506.9.
(Continued)

*Primary Examiner* — Paul D Kim
(74) *Attorney, Agent, or Firm* — Oblon, McClelland, Maier & Neustadt, L.L.P.

(57) ABSTRACT

A method using an electronic circuit component mounter including a circuit substrate conveying and holding device, and a bulk feeder that is a head-side feeder which can be moved to any position on a plane inside the mounter. An electronic circuit component mounting system including a control device that performs control such that that the component holding tool positioned at a component pickup position for a component supplied from the head-side feeder and an electronic component contact each other, and the electronic circuit component and the head-side feeder contact each other during contact between the component holding tool positioned at a component mounting position (Continued)

and an electronic circuit component and during contact between the electronic circuit component and the circuit substrate.

9 Claims, 16 Drawing Sheets

(51) Int. Cl.
*H05K 13/02* (2006.01)
*H05K 13/00* (2006.01)

(52) U.S. Cl.
CPC ......... *H05K 13/028* (2013.01); *H05K 13/043* (2013.01); *H05K 13/0404* (2013.01)

(56) References Cited

U.S. PATENT DOCUMENTS

| | | | |
|---|---|---|---|
| 5,852,869 A | 12/1998 | Gieskes et al. | |
| 6,282,779 B1* | 9/2001 | Nakano | H05K 13/0404 29/707 |
| 2015/0237772 A1* | 8/2015 | Nozawa | H05K 13/021 29/703 |
| 2016/0278251 A1* | 9/2016 | Tanaka | H05K 13/0465 |

FOREIGN PATENT DOCUMENTS

| | | | |
|---|---|---|---|
| JP | 7-15169 A | | 1/1995 |
| JP | 7-38300 A | | 2/1995 |
| JP | 11307992 A | * | 11/1999 |
| JP | 2001-267367 A | | 9/2001 |
| JP | 2001-287826 A | | 10/2001 |
| JP | 2002-280793 A | | 9/2002 |
| JP | 3552733 B2 | | 5/2004 |
| JP | 2008-004626 A | | 1/2008 |
| JP | 2008-198778 A | | 8/2008 |
| JP | 2008-270332 A | | 11/2008 |
| JP | 2013-069798 A | | 4/2013 |
| WO | WO 2013/042544 A1 | | 3/2013 |

OTHER PUBLICATIONS

Office Action dated Jun. 6, 2017 in Japanese Patent Application No. 2015-519600 (submitting English translation only).
International Search Report dated Nov. 26, 2013 for PCT/JP2013/072145 filed on Aug. 20, 2013.
Office Action dated Nov. 4, 2016 in Japanese Patent Application No. 2015-519600 submitting English translation only.
Office Action dated Oct. 9, 2017 in Chinese Patent Application No. 201380076911.6 (submitting English translation only).

* cited by examiner

[FIG. 1]
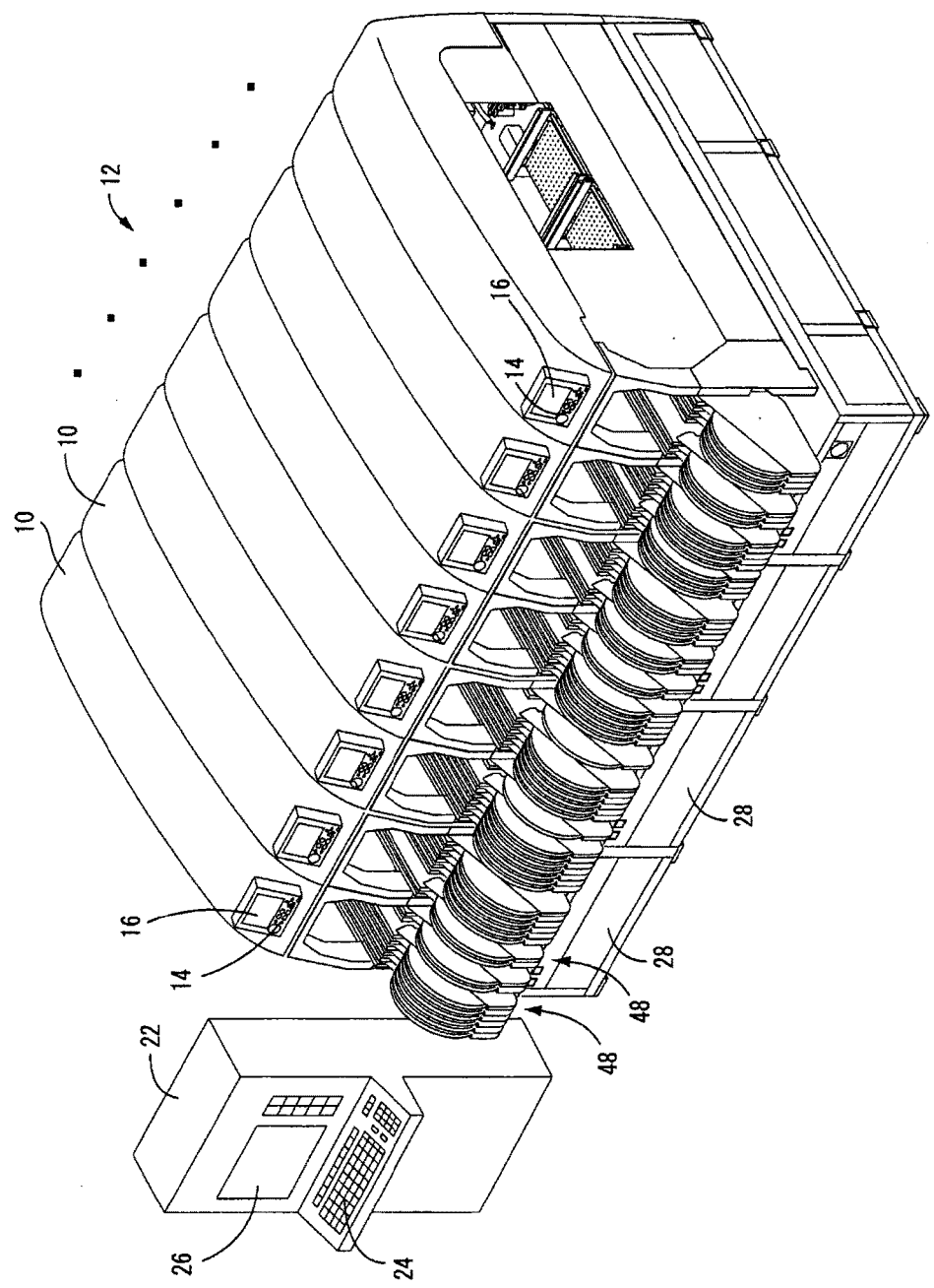

[FIG. 2]
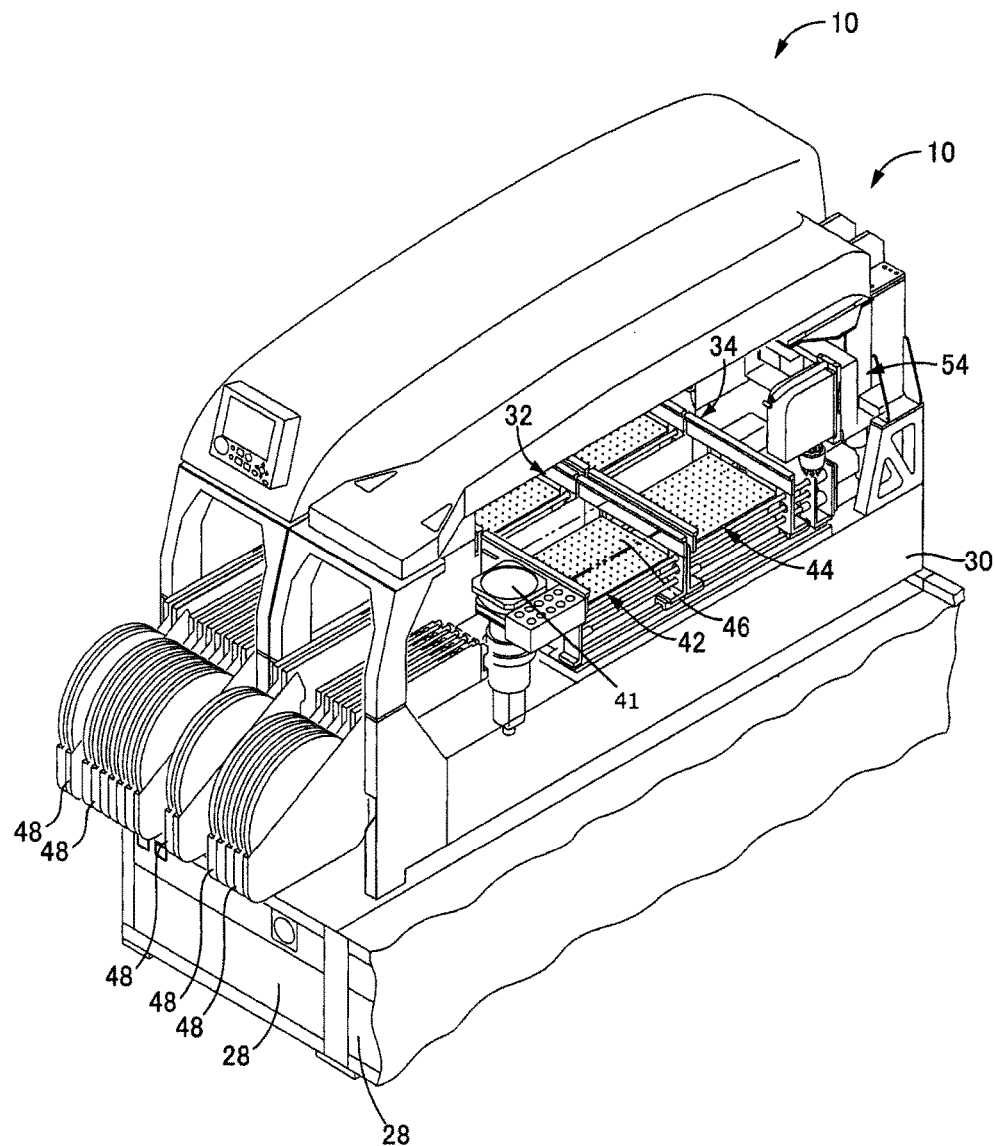

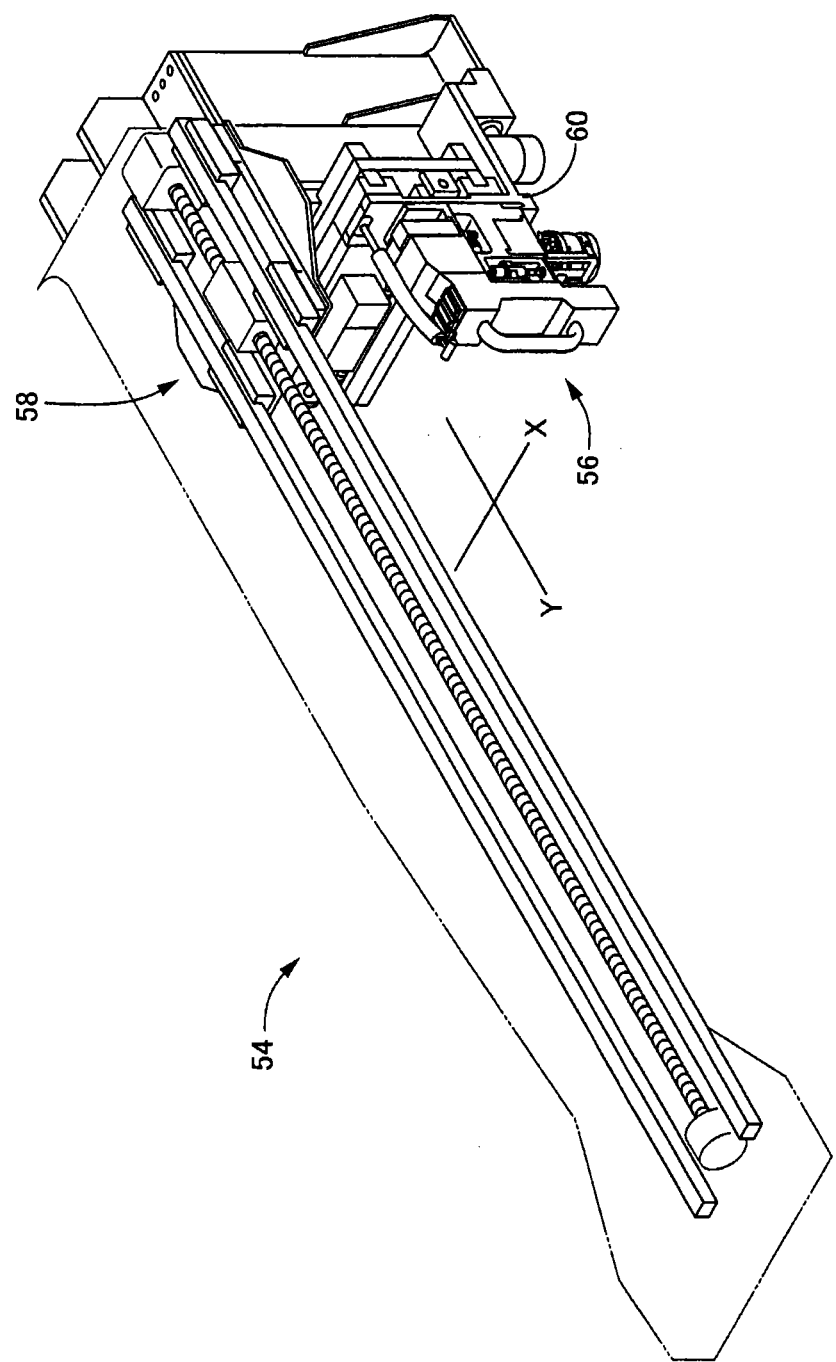
[FIG. 3]

[FIG. 4]
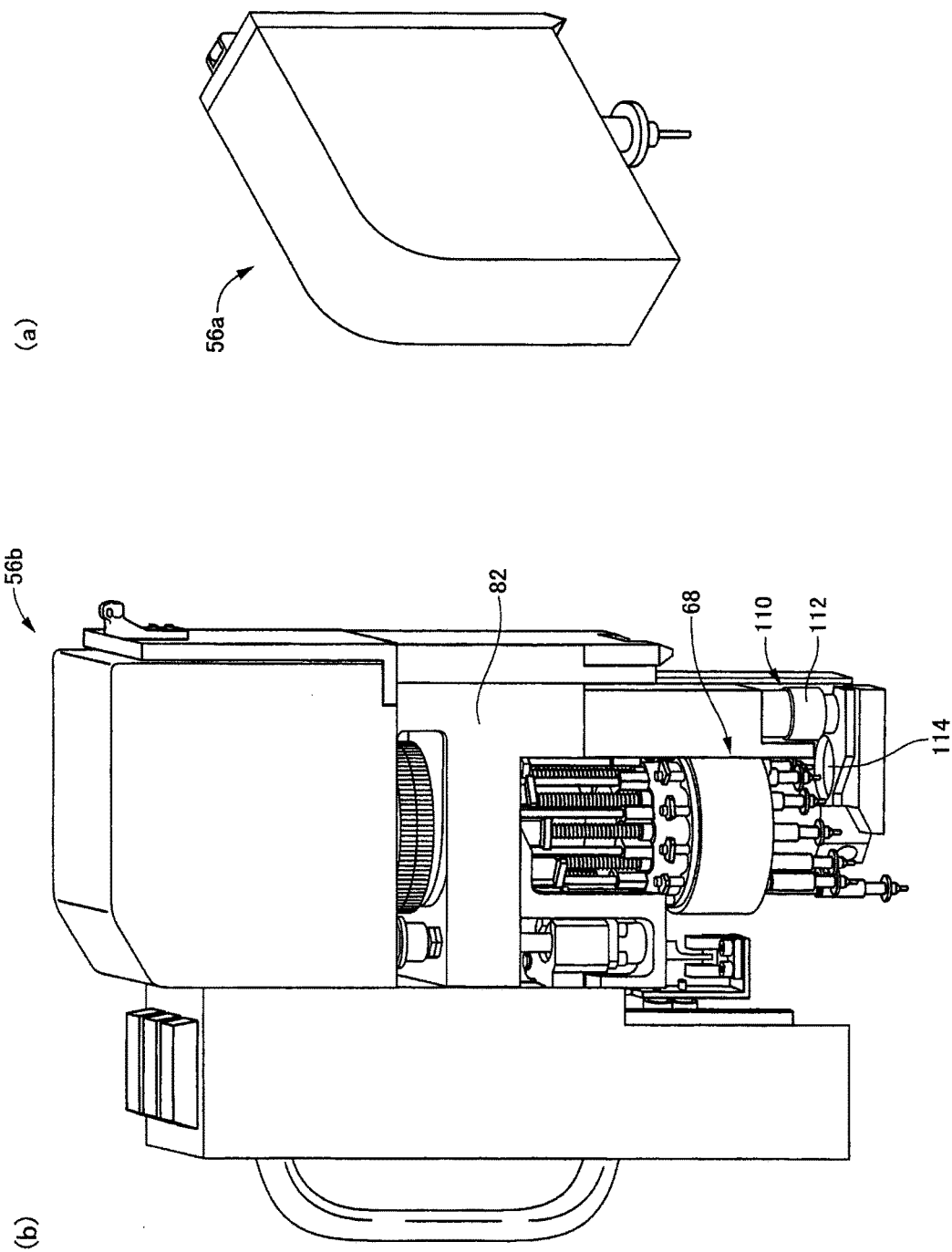

[FIG. 5]
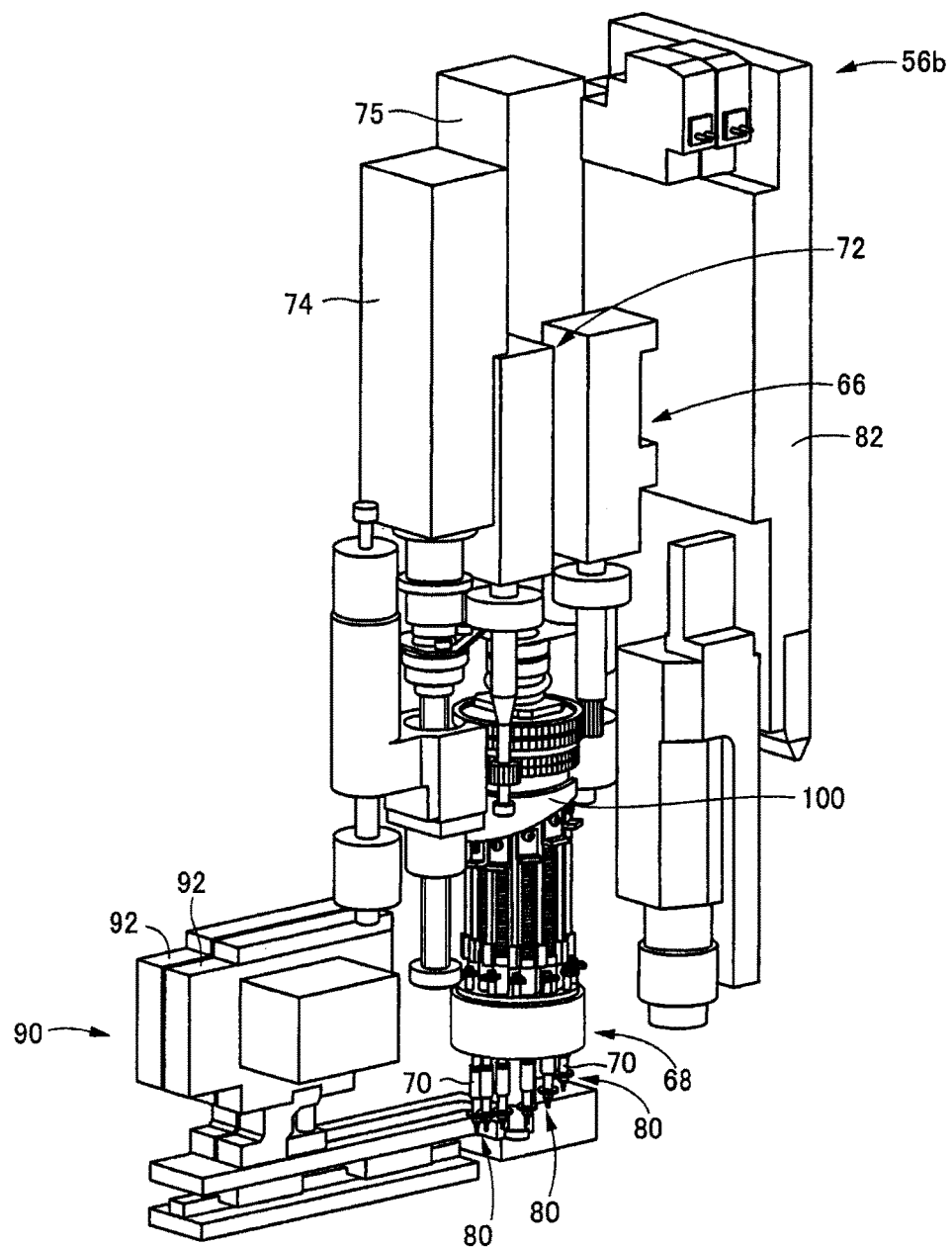

[FIG. 6]
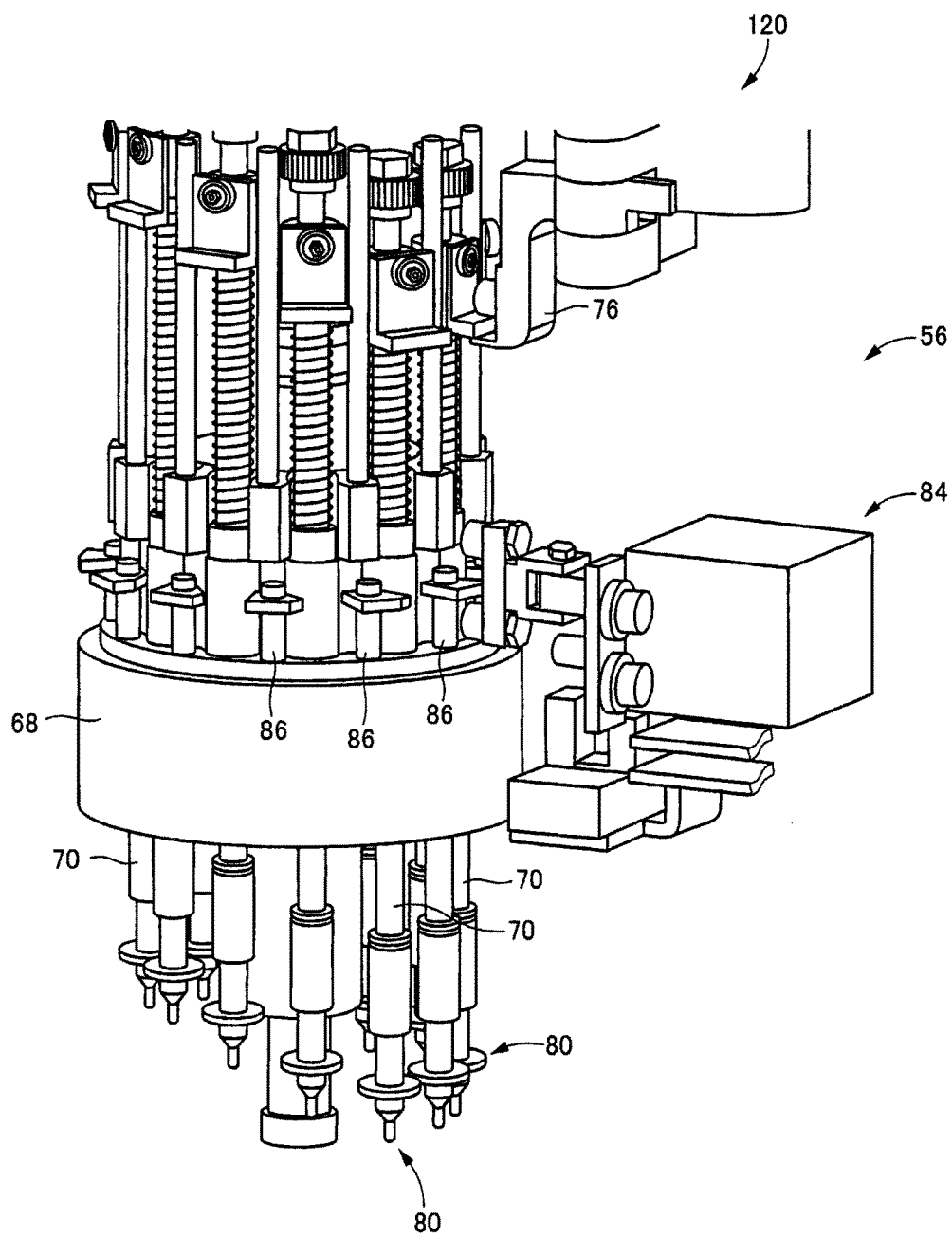

[FIG. 7]
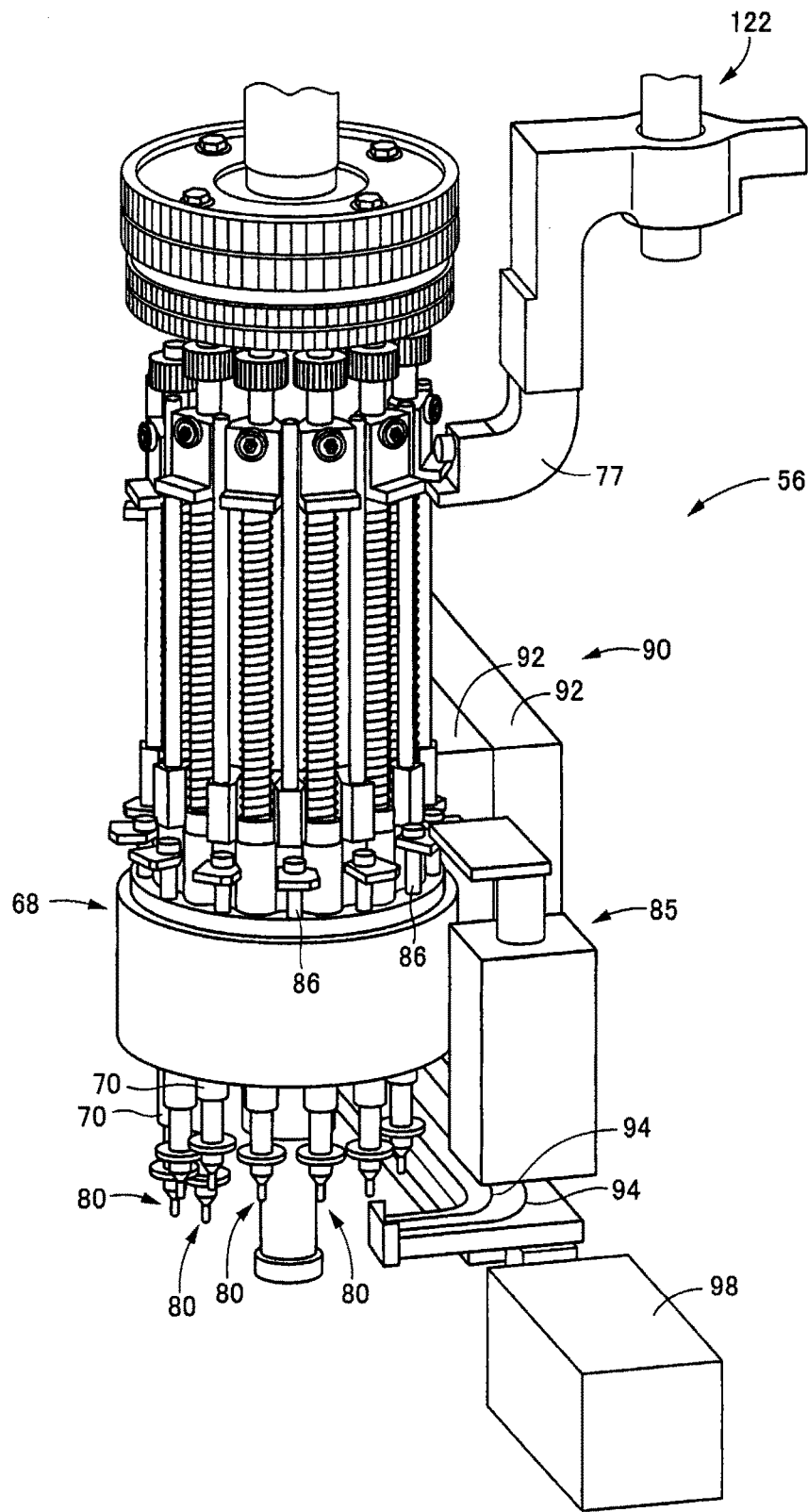

[FIG. 8]
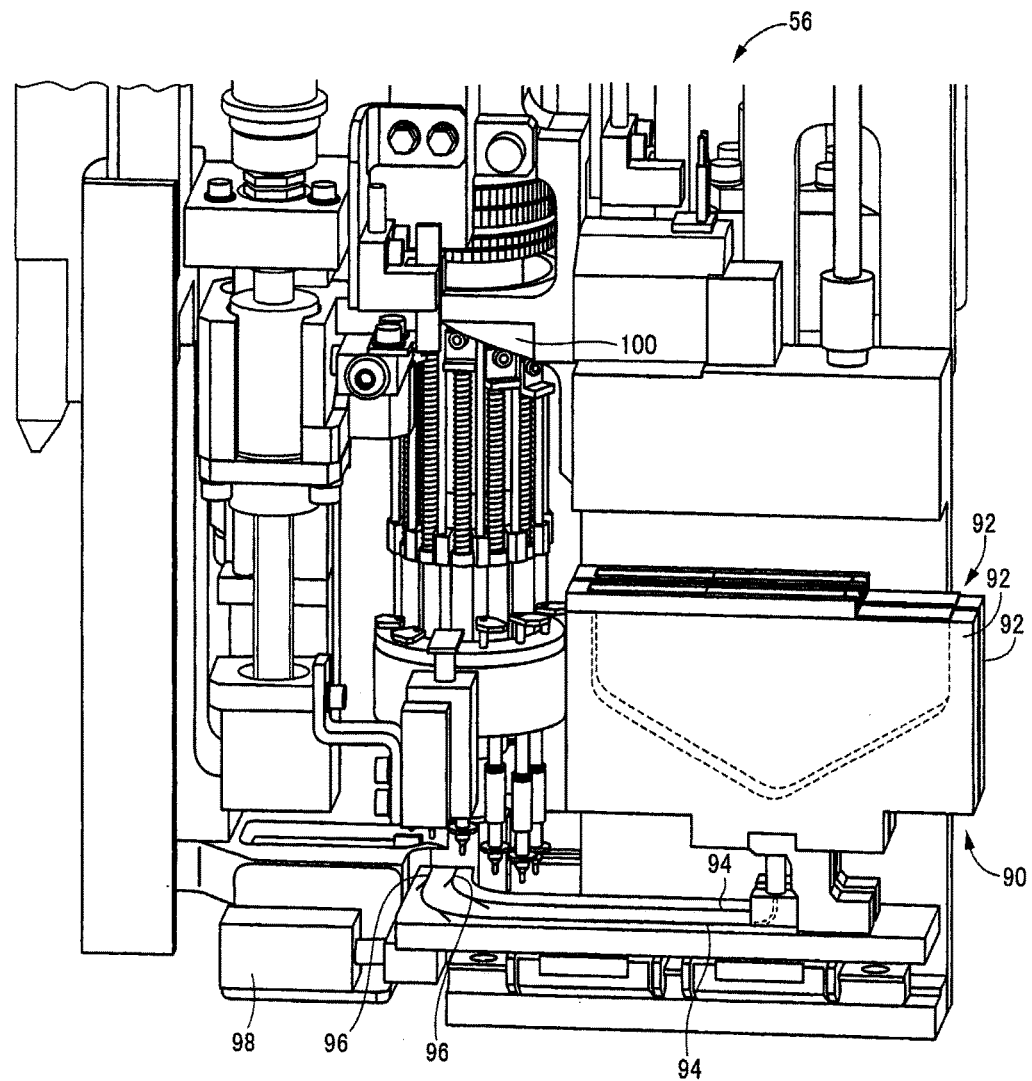

[FIG. 9]
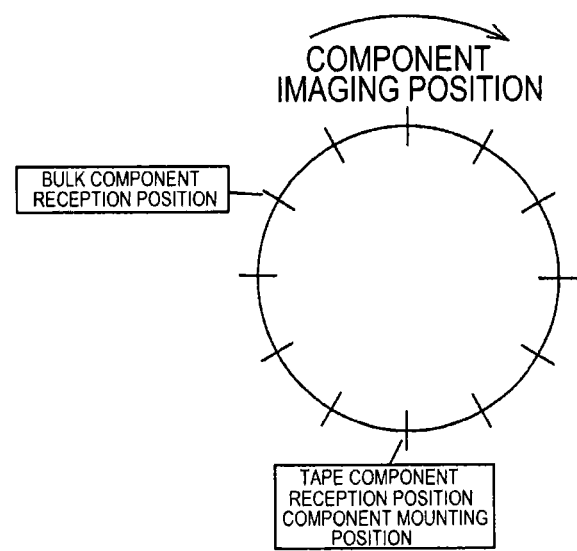

[FIG. 10]
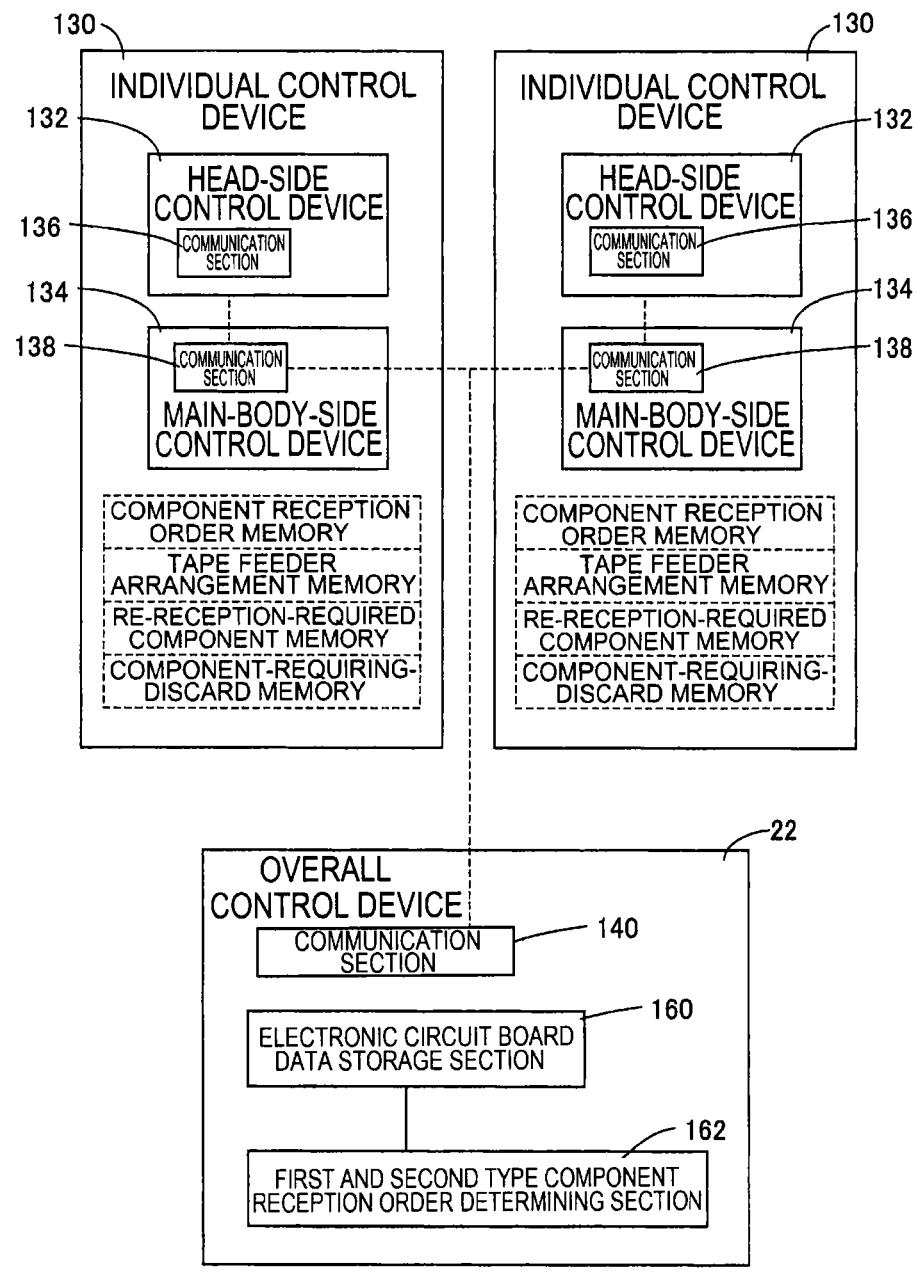

[FIG. 11]
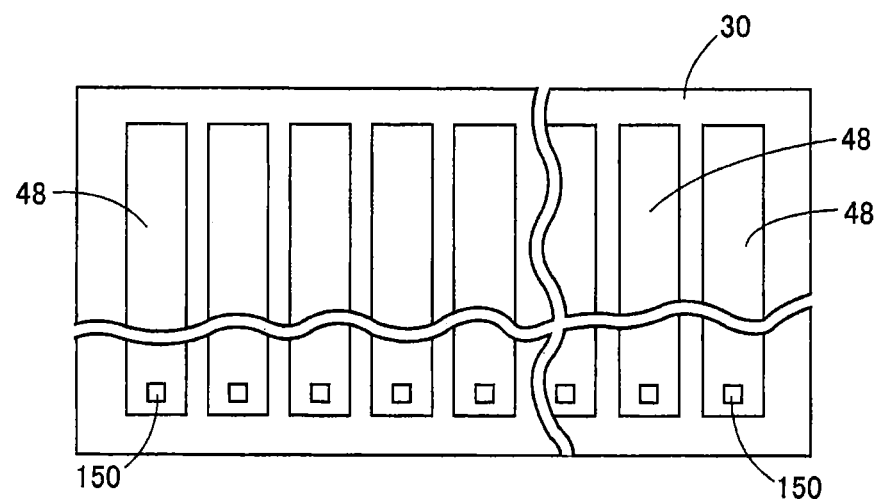
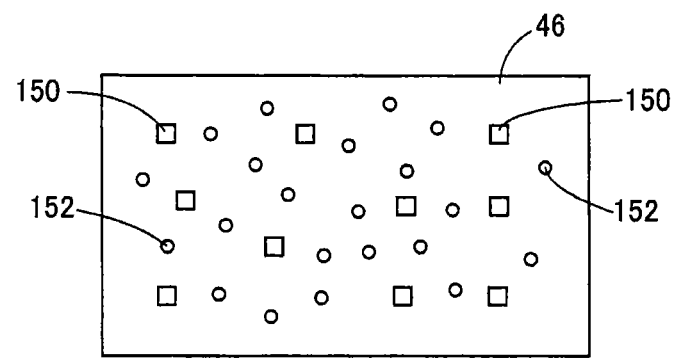

[FIG. 12]
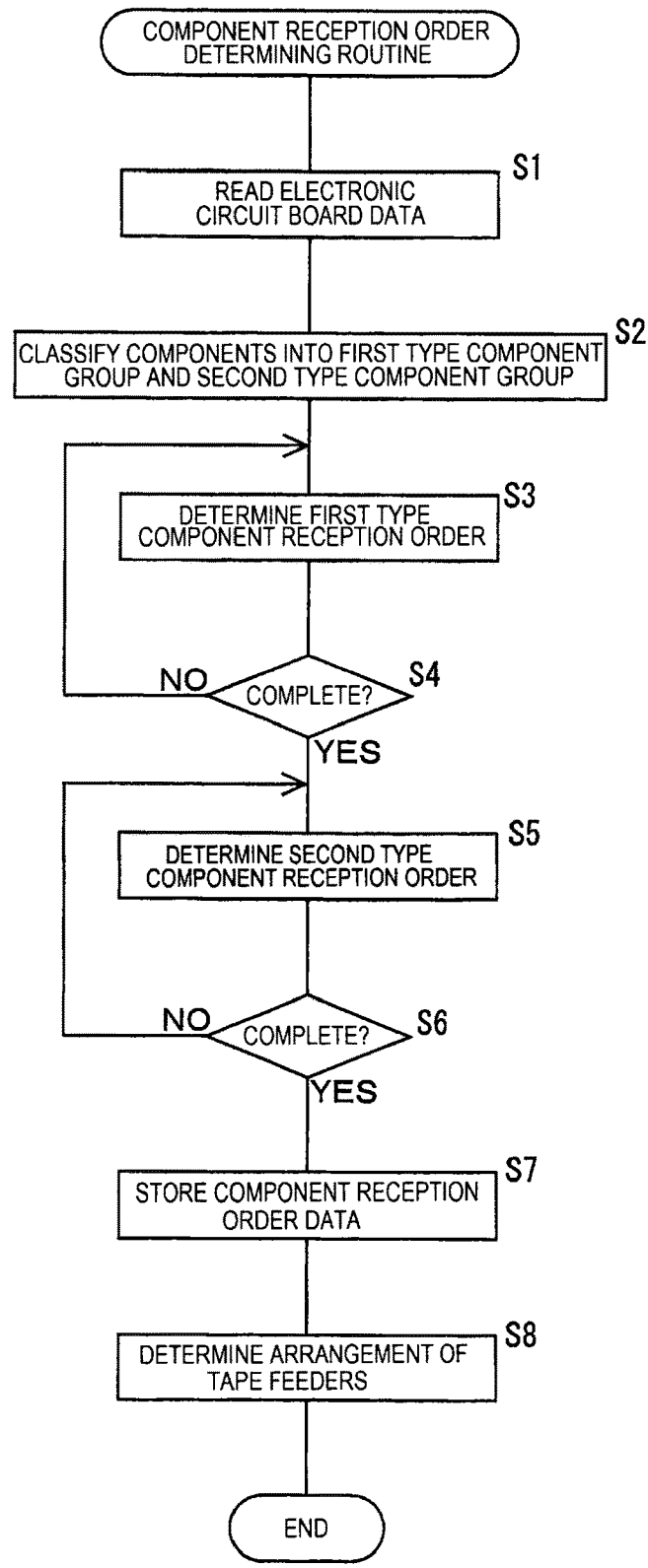

[FIG. 13]
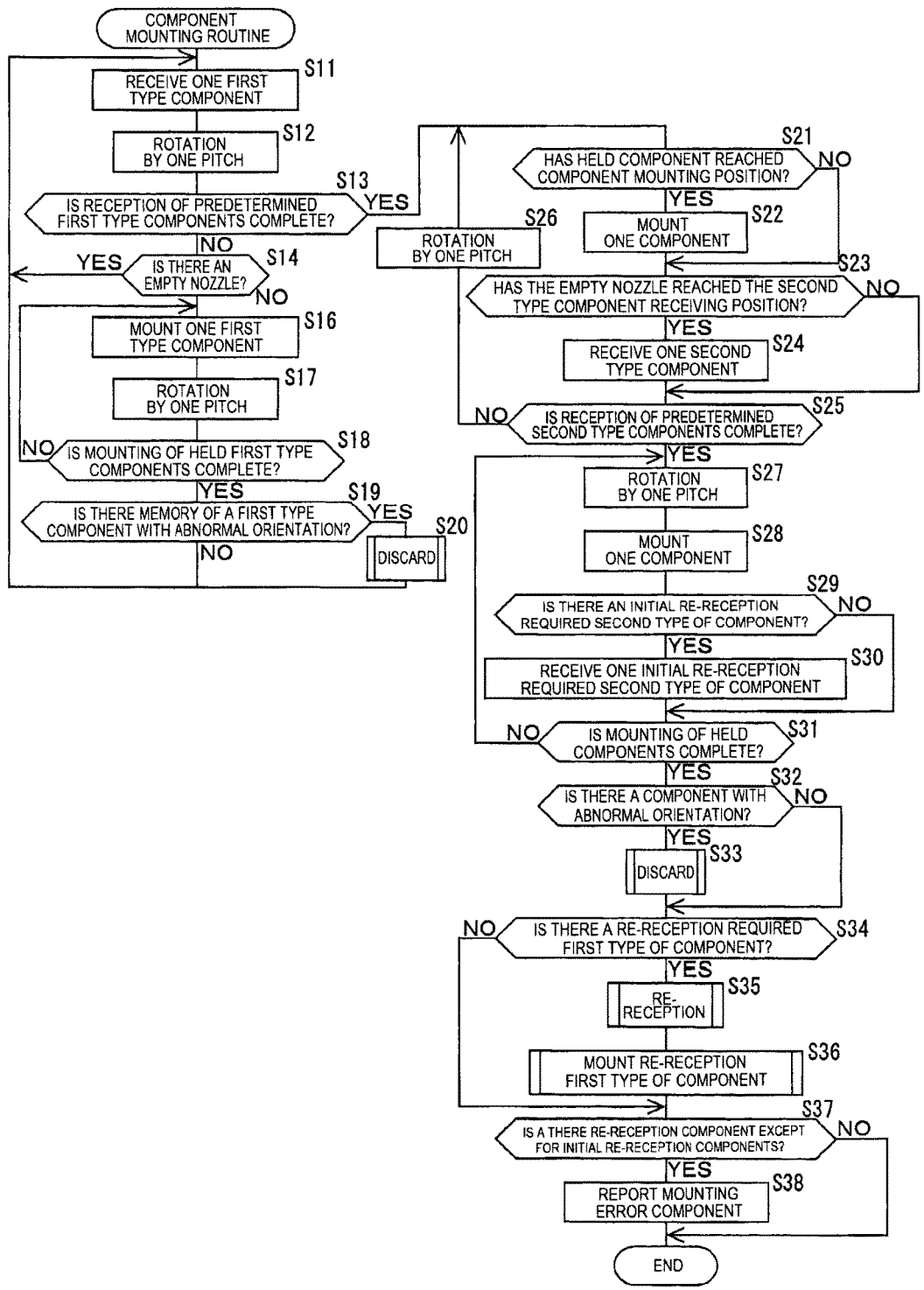

[FIG. 14]
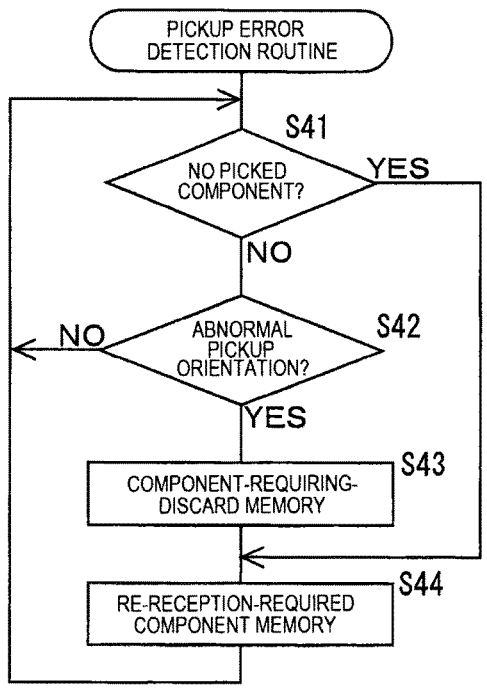
[FIG. 15]
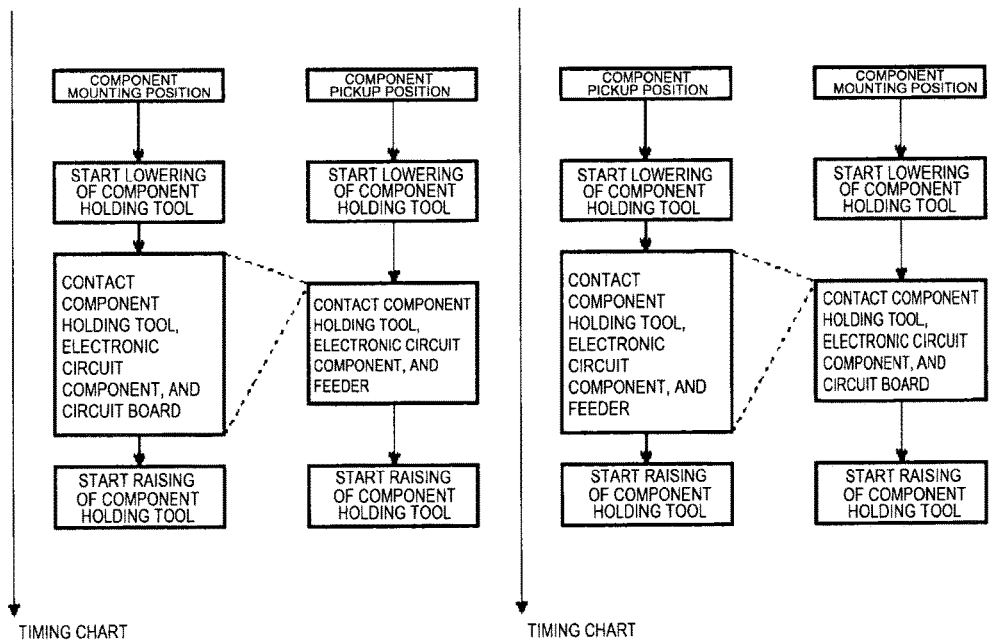

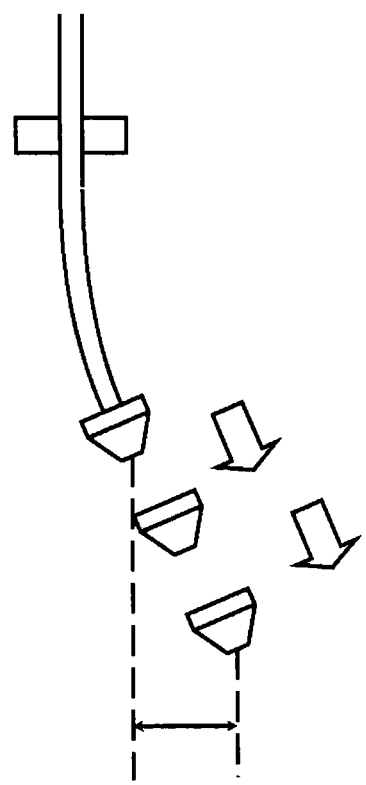
[FIG. 16]

[FIG. 17]
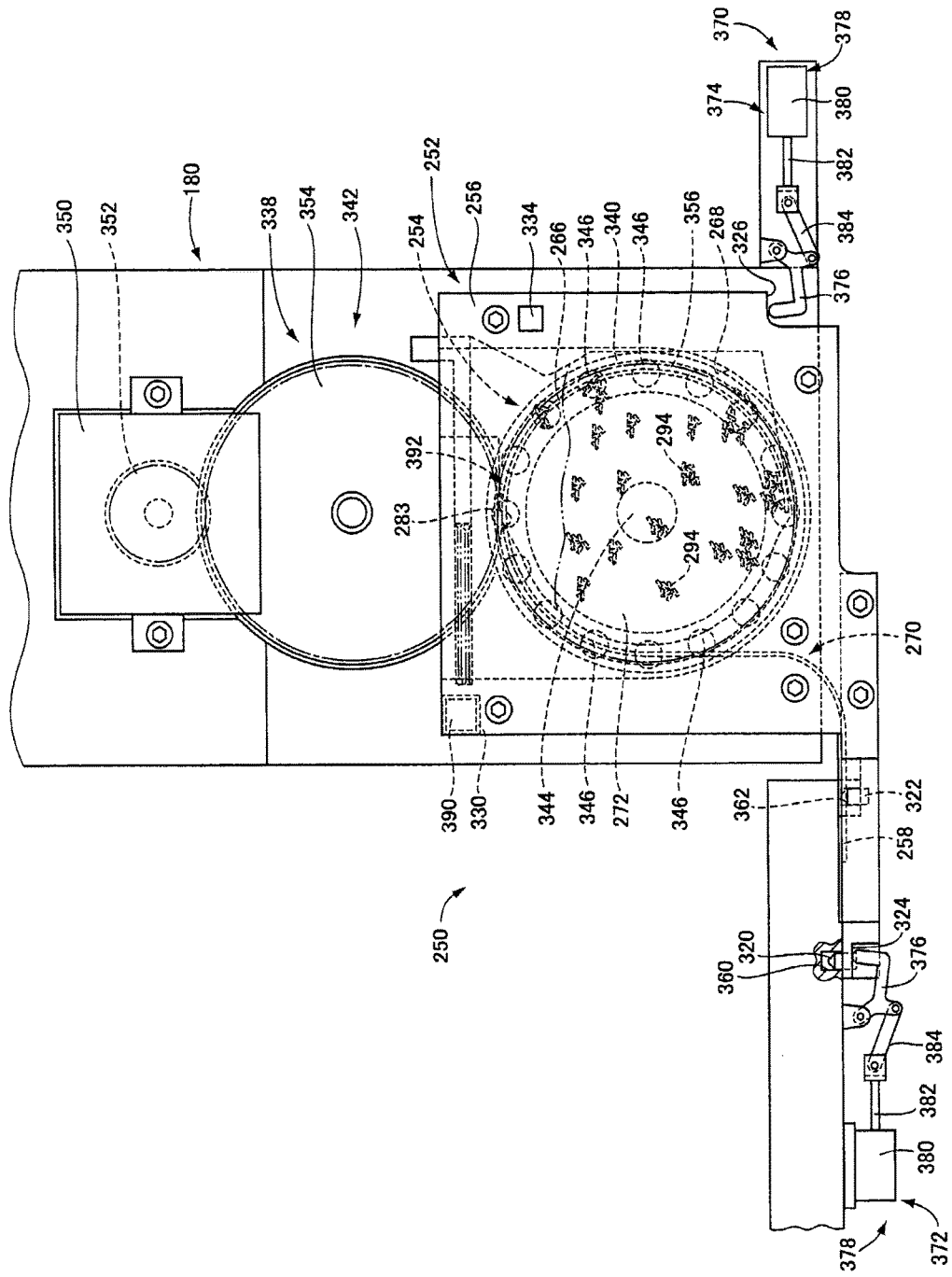

ELECTRONIC CIRCUIT COMPONENT MOUNTING SYSTEM

TECHNICAL FIELD

The present disclosure relates to an electronic circuit component mounting system comprising: a mounting machine main body on which is held a head main body that is moved inside the mounting machine main body by a head moving device; and a mounting device that mounts electronic circuit components using multiple component holding tools and at least one head-side feeder that supplies electronic circuit components provided on the head main body; wherein the mounting device picks up and mounts electronic circuit components supplied from the head-side feeder.

BACKGROUND ART

Patent literature 1 describes an electronic circuit component mounter that includes multiple mounter-main-body-side feeders 26, and multiple bulk feeders 18 as head-side feeders, and an electronic circuit component mounting method that uses the electronic circuit component mounting machine. In patent literature 2, in an electronic circuit component mounter that takes electronic circuit components out of multiple tape feeders 4a as mounter-main-body-side feeders by using multiple mounting heads 16 including multiple suction nozzles 16a, and mounts the electronic circuit components on a printed circuit board W, an operation for conveying the printed circuit board W from a waiting position to a mounting operation performing position, and a mounting preparation operation performed by the mounting head 16, are simultaneously performed. According to the electronic circuit component mounter and the electronic circuit component mounting method described in patent literature 1, in order to take the electronic circuit components out of multiple bulk feeders 18, since it is not necessary to move a mounting device to the mounter-main-body-side feeders, it is possible to efficiently perform a mounting operation; in the electronic circuit component mounter described in patent literature 2, since a loading operation of the printed circuit board W and the mounting preparation operation performed by the mounting head 16 are performed simultaneously, it is possible to efficiently perform a mounting operation. Further, in patent literature 3, picking up a chip capacitor by attracting a magnetic material provided on the surface of the chip capacitor using the magnetic force of an electromagnet and then mechanically holding the chip capacitor with an arm section is described.

CITATION LIST

Patent Literature

Patent Literature 1: JP-A-2002-280793
Patent Literature 2: JP-A-2008-198778
Patent Literature 3: JP-A-Heisei 05-304052

SUMMARY

Problem to be Solved

The present disclosure, taking account of the above background circumstances, improves on the electronic circuit component mounter and electronic circuit component mounting system disclosed in patent literature 1 to 3.

Means for Solving the Problem

The above issues are solved by an electronic circuit component mounting system comprising: a mounter main body; (a) a circuit substrate conveying and holding device held on the mounter main body that conveys and fixes and holds a circuit substrate; (b) a head main body that is moved with respect to the mounter main body by a head moving device to any position on a movement plane inside the mounter main body; (c) at least one head-side feeder held on the head main body that supplies electronic circuit components; (d) a mounting device that receives the electronic circuit component from the head-side feeder and mounts the electronic circuit components on a circuit substrate held by the circuit substrate conveying and holding device using multiple component holding tools provided on the head main body; (e) a control device that controls the circuit substrate conveying and holding device, the head moving device, the head-side feeders, and the mounting device; (f) and a control device that performs control such that, during contact between the component holding tool positioned at a component mounting position and an electronic circuit component and during contact between the electronic circuit component and the circuit substrate, the component holding tool positioned at a component pickup position of a component supplied from the head-side feeder and an electronic component contact each other, and the electronic circuit component and the head-side feeder contact each other.

Effects

With the above disclosure, because control is performed such that the component holding tool positioned at a component pickup position for a component supplied from the head-side feeder and an electronic component contact each other, and the electronic circuit component and the head-side feeder contact each other, during contact between the component holding tool positioned at a component mounting position and an electronic circuit component and during contact between the electronic circuit component and the circuit substrate, an effect of improving mounting operation efficiency is obtained.

BRIEF DESCRIPTION OF DRAWINGS

FIG. 1 is a perspective view showing an electronic circuit component mounting system according to an embodiment.

FIG. 2 is a perspective view showing two mounting modules which are parts of the electronic circuit component mounting system with the ceiling panel cover of one of the modules removed.

FIG. 3 is a perspective view showing a mounting head and a head moving device of a mounting device of the mounting module.

FIG. 4 is a perspective view showing the mounting head, in which FIG. 4(a) is a diagram showing a mounting head provided with one nozzle holder, and FIG. 4(b) is a diagram showing a mounting head provided with 12 nozzle holders.

FIG. 5 is a perspective view showing the mounting head provided with 12 nozzle holders with the cover removed.

FIG. 6 is a perspective view showing a valve switching device, a raising/lowering device, suction nozzles, and nozzle holders of the mounting head provided with 12 nozzle holders.

FIG. 7 is a perspective view showing a different valve switching device, a different raising/lowering device, suction nozzles, and nozzle holders of the mounting head provided with 12 nozzle holders.

FIG. 8 is a perspective view showing the mounting head provided with 12 nozzle holders from the side on which a bulk feeder is provided.

FIG. 9 is a schematic diagram for describing stop positions of the suction nozzles by the rotation of a rotation holding body in the mounting head provided with 12 nozzle holders.

FIG. 10 is a schematic block diagram showing a control device of the electronic circuit component mounting system shown in FIG. 1.

FIG. 11 is a schematic plan view showing the relative positional relationship between tape feeders and an electronic circuit to be assembled in one of the mounting modules.

FIG. 12 is a flowchart showing a component reception order determining routine performed in a general control device of the electronic circuit component mounting system shown in FIG. 1.

FIG. 13 is a flowchart showing major parts of a component mounting routine performed in each of the mounting modules.

FIG. 14 is a flowchart showing a part of the component mounting routine.

FIG. 15 is a flowchart showing a part of the component mounting routine.

FIG. 16 is a diagram showing the correction amount of raising/lowering axis bend.

FIG. 17 is a diagram of a device that performs component supply using magnetic force in a head-side feeder.

DESCRIPTION OF EMBODIMENT

Hereinafter, an embodiment will be described with reference to the drawings. The structures of an electronic circuit component mounting system and a mounting module are the same as those described in detail in the specification of, for example, Japanese Patent Application No. 2011-206452, and thus, the description thereof will be briefly presented.

As shown in FIG. 1, multiple mounting modules 10, which are an example of the electronic circuit component mounter, are lined up to form component mounting line 12. Each mounting module 10 is provided with an operation device 14, a display device (display) 16, and an individual control device, and the individual control device is further controlled overall by an overall control device 22. Overall control device 22 is also provided with an operation device 24 and display device (display) 26. The component mounting line 12 and the overall control device 22 constitute the electronic circuit component mounting system.

One constituent unit of component mounting line 12 is shown in FIG. 2, with one constituent unit being configured such that two mounting modules 10 are supported by a common support table 28; mounting modules 10 are adjacent to each other in the width direction, and are supported on support table 28 movable in a forward/backward direction such that an operator can access the inside of the each mounting module 10 by pulling the mounting modules forward one by one. Each mounting module 10 includes two front and rear board conveyors 32 and 34 supported by a main body frame 30; a board support device that can be raised/lowered is provided with respect to each board conveyor 32 and 34 to constitute board holding devices 42 and 44 that fixedly hold a circuit board 46 in cooperation with a portion of the respective board conveyors 32 and 34.

Each mounting module 10 is provided with multiple tape feeders 48, which are detachably held on main body frame 30, that each supply a type of electronic circuit component (hereafter abbreviated to component) one by one, and a mounting device 54 that removes components from the tape feeders 48 one by one and mounts the components on circuit boards 48 held by board holding device 42 and 44 respectively. As shown enlarged in FIG. 3, mounting device 54 includes mounting head 56 and head moving device 58 that moves mounting head 56 in the X-axis direction (left-right direction) and Y-axis direction (front-rear direction). As a mounting head, those such as the examples 56a and 56b shown in FIG. 4 are prepared, and these mounting heads are selectively attached to an adapter 60 shown in FIG. 3 by an attaching/detaching device.

Among the above multiple different types of mounting heads 56a and 56b, the configuration of mounting head 56b shown in FIG. 4(b) is representatively illustrated in FIG. 5. Mounting head 56b is provided with a rotation holding body 68 rotated by a fixed angle each time by a holding body rotating motor 66, and multiple mounting units 70 are held on the rotation holding body 68 spaced at a fixed angle so as to be movable in an axial direction and individually rotatable. Accordingly, each mounting unit 70 revolves around a rotational axis line of the rotation holding body 68 by the rotation of the rotation holding body 68, and can rotate around its own axis line. The absolute phase of the mounting unit 70 is controlled through connected control of the rotation of a unit rotating motor 72 and the rotation of the holding body rotating motor 66. Also, with the multiple mounting units 70 in a specific revolving position, the mounting units are raised/lowered in an axial direction by raising/lowering drive members 76 and 77 (refer to FIGS. 6 and 7) that are raised/lowered by two unit raising/lowering motors 74 and 75. A suction nozzle 80 is detachably held on the lower end of each of the multiple mounting units 70, and each suction nozzle 80 is raised/lowered with the raising/lowering of each mounting unit 70, removes and holds through suction a component from a tape feeder 48 that is the mounter-main-body-side feeder or from a bulk feeder 90 (refer to FIGS. 7 and 8) that is the head-side feeder described below, and mounts the component on circuit board 46 held by board holding device 42 and 44. The rotation holding body 68, motors 66, 72, 74, and 75, and the like are held on head body 82 shown in FIG. 5, and are attachable/detachable all together by the attachment/detachment of head main body 82 to/from adapter 60 (refer to FIG. 3).

Mounting module 10 can be considered as being divided into a mounting head 56 side and a mounter main body side to/from which the mounting head is attached/detached; the mounter main body side includes main body frame 30 of mounting module 10, the board conveyors 32 and 34 held on the main body frame, tape feeders 48, and head moving device 58 and the like. Note that, an electrical control device of mounting module 10 is provided inside the support table 28, thus, a section that accommodates the electrical control device of support table 28 may be naturally considered as also being the mounter main body side. The holding and releasing of a component by the suction nozzle 80 is performed by control of a negative pressure supply device and a positive pressure supply device (not shown) provided on the mounter main body side, and control of pressure switching units 84 and 85 provided on mounting head 56 shown in FIGS. 6 and 7. The holding and releasing of components is controlled by selective supply of negative pressure or positive pressure to suction nozzle 80 and the opening to the atmosphere of suction nozzle 80 by valve spool 86 being moved in an axial direction by pressure switching units 84 and 85.

The multiple tape feeders 48 supply components held in component holding tape one by one; the bulk feeder 90 arranges the components housed in a loose state in component housing chambers 92 shown in FIG. 8 in a line and supplies the components from component supply section 96 at an end of guide passage 94. Multiple component supply sections 96 of bulk feeder 90 are lined up in the Y-axis direction, and by moving bulk feeder 90 in the Y-axis direction by feeder moving device 98, one component supply section 96 at a time is selectively moved to a position corresponding to a mounting unit 70.

As a result, as shown in FIG. 9, mounting head 56 is provided with a bulk component reception position corresponding to component supply section 96 of the bulk feeder 90, and a tape component reception position corresponding to an end of a tape feeder 48; the tape component reception position is a common component mounting position for tape components and bulk components. Also, mounting head 56b is provided with a component imaging position between the bulk component reception position and the tape component reception position (component mounting position). As shown in FIG. 8, with mounting head 56b, the distance of a suction nozzle 80 from board holding devices 42 and 44 changes based on the revolution of suction nozzles 80 due to cam 100, and, as shown in FIG. 4(b), component imaging device 110 is provided at a maximum distance position where a suction nozzle 80 is furthest from board holding devices 42 and 44. Component imaging device 110 includes a light guiding device 114 and CCD camera 112 forming an imaging device. In the present embodiment, a minimum distance stop position is set as the component mounting position where the electronic circuit components are mounted on the circuit boards, a maximum distance stop position closest to the component mounting position, which is positioned on a downstream side from the component mounting position in the rotational direction (the direction indicated by the arrow in FIG. 9) of the rotation holding body 68 at the time of mounting, is set as the bulk component reception position, and downstream from that a stop position separated from the component mounting position by 180 degrees is set as the component imaging position.

As shown in FIGS. 6 and 7, raising/lowering devices 120 and 122 are respectively provided at positions corresponding to the component mounting position (tape component reception position) and the bulk component reception position of head main body 82, and advance/retract and raise/lower mounting units 70 in an axial direction with respect to rotation holding body 68. As shown in FIG. 6, raising/lowering device 120 is provided with raising/lowering drive member 76 which is raised/lowered by the unit raising/lowering motor 74, and lowers a mounting unit 70 towards a circuit board 46 held by the board holding device 42 or 44, or towards the component supply section of the tape feeder 48, at the component mounting position. Also, as shown in FIG. 7, raising/lowering device 122 is provided with raising/lowering drive member 77 which is raised/lowered by the unit raising/lowering motor 75, and lowers a mounting unit 70 towards component supply section 96 of the bulk feeder 90. The pressure switching units 84 and 85 are provided to correspond with the raising/lowering devices 120 and 122, and perform selective supply of negative pressure and positive pressure to suction nozzle 80 and opening of suction nozzle to the atmosphere to match the raising/lowering of the mounting unit 70, thereby controlling the holding and releasing of the component.

Note that, because the stroke of raising/lowering device 120 is large compared to raising/lowering device 122, there are cases in which deviation occurs in the direction of the surface of circuit board 46 when suction nozzle 80 is lowered from the height at the component imaging position to the surface of circuit board 46. Accordingly, the position of suction nozzle 80 when holding or mounting a component may be corrected by measuring the deviation in advance using image processing device 41.

The operations of holding body rotating motor 66, unit rotating motor 72, unit raising/lowering motors 74 and 75, and pressure switching units 84 and 85, and so on are controlled by the individual control devices 130 of the respective mounting modules 10 shown in FIG. 10. Individual control device 130 includes a head-side control section 132 and a main-body-side control section 134; the head-side control section 132 performs sending and receiving of information and commands by communicating with communication section 138 of main-body-side control section 134 using communication section 136, and electrical power is supplied to head-side control section 132 from main-body-side control section 134 through a power line (not shown). Main-body-side section 134 is further capable of performing sending and receiving of information and commands with the overall control device 22 via its own communication section 138 and communication section 140.

As described above, each mounting module 10 can mount the components supplied from any one of the tape feeders 48 and the bulk feeders 90 on the circuit boards 46; however, there may be different circumstances for removing the components out of the respective feeders 48 and 90. For this reason, in the present embodiment, when it is necessary to mount components 150 supplied from tape feeders 48 indicated by square marks and components 152 supplied from bulk feeders 90 indicated by circle marks on one circuit board 46 as shown in FIG. 11, the difference between the circumstances of both the feeders 48 and 90 is considered in order to improve the efficiency of mounting operation. This point is described below.

FIG. 12 is a flowchart showing a component reception order determining routine for determining the reception order of tape components 150 and bulk components 152 using the multiple suction nozzles 80 (mounting units 70) that are sequentially revolved to the multiple positions shown in FIG. 9 by the rotation of rotation holding body 68, in one of the mounting modules 10. The component reception order determining routine may be performed in any mounting module 10, but is performed by the general control device 22 in the present embodiment. For this reason, as shown in FIG. 10, an electronic circuit board data memory section 160 and a component reception order determining section 162 are provided in general control device 22. The electronic circuit board data memory section 160 is a part that stores electronic circuit board data including the types of the tape components 150 and the bulk components 152 (hereinafter, referred to as components 150 and 152 unless it is necessary to particularly distinguish the components from each other) to be mounted by component mounting line 12, coordinates of the component mounting positions, and component mounting orientation (rotation position); the component reception order determining section 162 is a part that performs the component reception order determining routine shown in FIG. 12 for each of the multiple mounting modules 10. Based on the electronic circuit board data stored in electronic circuit board data memory section 160, the components 150 and 152 to be mounted by each mounting module 10 are determined, and the reception order of the determined components 150 and 152 in the respective mounting modules 10 is determined.

For example, the electronic circuit board data is stored in electronic circuit board data memory section 160 from a host computer that manages information required for the operation of the entire factory including mounting line 12 via the communication section 140 by an operator controlling operation device 24 while watching the display of display device 26. The components 150 and 152 to be mounted by each mounting module 10 are basically determined such that all the multiple suction nozzles 80 held by the rotation holding body 68 of one mounting module 10 are the same. In so doing, operation efficiency is improved.

Also, when the determination of S13 is YES, S21 to S26 are repeatedly performed, and the mounting of tape components 150 and the reception of bulk components 152 are performed simultaneously. Firstly, in S21, it is determined whether the component (components 150 at this point in time) held by the suction nozzle 80 has reached the component mounting position of FIG. 9; this determination is initially NO, and in S23 it is determined whether an empty nozzle has reached the bulk component reception position. If the determination is YES, in S24 one bulk component 12 is held; however, the determination of S23 is not YES until the empty suction nozzle positioned in the component mounting position (tape component reception position) reaches the bulk component reception position, and in S25 it is determined whether the reception of the predetermined bulk components 152 has been completed. Since this determination is initially NO, the rotation holding body 68 is rotated by one pitch in S26, and S21 and the subsequent steps are performed again. During the repeated performing of the above, if the determination of S21 is YES, one component is mounted in S22. Also, if the determination of S23 is YES, one bulk component 152 is held in S24. It takes time to respectively mount the component in S22 and hold the second type component 152 in S24; however, since the YES determinations of S21 and S23 merely lead to the opportunity to start performing S22 and S24, it is not the case that the next determination is performed waiting for the completion of S22 and S24, thus, after the determination of both S21 and S23 becomes YES, the mounting operation in S22 and the holding operation in S24 are in effect performed simultaneously. The mounting of tape component 150 and the holding of bulk component 152 are performed simultaneously while tape component 150 is reaching the component mounting position; however, if a bulk component 152 reaches the component mounting position, subsequently the reception and mounting of bulk components 152 are performed simultaneously.

Further, as described in detail in FIG. 15, while a suction nozzle 80 (mounting unit 70) positioned at the component mounting position is contacting a tape component 150 or a bulk component 152, and while a tape component 150 or a bulk component 152 is contacting circuit board 46, controlled is performed such that a suction nozzle 80 (mounting unit 70) positioned at the bulk component reception position contacts a bulk component 152 and a bulk component 152 contacts bulk feeder 90. This control may be performed such that while a suction nozzle 80 (mounting unit 70) positioned at the bulk component reception position is contacting a bulk component 152, and while a bulk component 152 is contacting bulk feeder 90, a suction nozzle 80 (mounting unit 70) positioned at the component mounting position is contacting a tape component 150 or a bulk component 152, and a tape component 150 or a bulk component 152 is contacting circuit board 46. In addition, this may be applied when the holding of a tape component 150 and the holding of a bulk component 152 are being performed simultaneously. Note that circuit board 46 mentioned here includes solder printed on the circuit board, flux applied to the circuit board, and so on.

By performing this kind of control, because the efficiency of mounting operation is improved, and mounting and holding is performed when tape components 150 or bulk components 152 are very close together, deviation due to vibration and so on caused by the raising/lowering and so on of suctions nozzles 80 (mounting units 70) is harder to arise.

When the reception of the predetermined bulk components 152 has been completed and the determination of S25 is YES, the component mounting routine proceeds to S27. By the performing of S27 and S28, mounting of one component 150 or 152 (in most cases, this is bulk component 152, but in cases in which the quantity of bulk components 152 to be mounted is small, this may be tape component 150) is performed, and the presence/absence of a re-reception-required bulk component 152 is determined initially in S29. In S44 of the pickup error detecting routine, it is determined for each of the bulk components 152 whether that component has been stored for the first time. For each component 150 and 152, components for which re-reception is required for the second time and above are also stored in a re-reception-required component memory; however, as described below, because re-reception is not performed for the second time and above, and because re-reception of tape components 150 is performed separately, it is determined whether there is a bulk component for which re-reception has become necessary for the first time. If the determination of S29 is YES, the re-reception of the second type components 152 is performed in S30.

Continuing, in S31, it is determined whether the mounting of all the components 150 and 152 held by the mounting head 56b has been completed; however, the initial determination is naturally NO, and S27 and the subsequent steps are repeatedly performed. Soon the determination of S31 becomes YES, and it is determined in S32 whether a component is held on a suction nozzle 80 in an abnormal orientation, and it is determined in S43 of the pickup error detecting routine whether a component 150 or 152 has been stored as a component-requiring-discard; if a determination is YES, discarding is performed of all components-requiring-discard in S33. In most cases discarding of bulk components 152 is performed, but there are cases in which discarding of tape components 150 is performed. Then, in S34, it is determined whether there is a tape component 150 stored as a re-reception-required component based on S44 of the pickup error detecting routine; if the determination is YES, re-reception and mounting of all re-reception-required tape components is performed in S35 and S36. As described above, the re-reception of bulk components 152 is performed simultaneously with the mounting of components 150 and 152, whereas the re-reception of tape components 150 is performed all at once at the end to make the number of times mounting head 56b moves between tape feeders 48 and the printed circuit board holding devices 42 and 44 as small as possible.

After the re-reception and mounting of the tape components 150 are performed, or if the determination of S34 is NO, S37 and S38 are performed. It is determined whether, among the components 150 and 152, there is a component which has been stored as a re-reception-required component for a second time or above in the re-reception-required component memory; if there is such a component, that fact is displayed on display device 16 of each mounting module 10. If re-reception is required again for the same component 150 or 152 for which re-reception has already been performed once, it is likely that this is not a coincidence, but that there is some cause for the occurrence which needs to be investigated by an operator, therefore the fact that the cause needs to be investigated is displayed on display device 16. Note that, as well as or instead of this display being displayed of display device 16 of mounting module 10, it may be displayed on display device 26 of overall control device 22 while indicating to which of the mounting modules 10 it applies.

Although description was omitted in the above description in order to avoid complicating matters, the revolving positions of suction nozzles 80 and the components 150 and 152 held by the suction nozzles change by one pitch each time the rotation holding body 68 is rotated by one pitch in S12, S17, S26, and S27 and so on. A part that stores the change in this revolving position is provided in individual control device 130 of each mounting module 10, and the determinations in the respective steps of the component mounting routine are performed based on the data stored in this part.

The holding and releasing of a component by the suction nozzle 80 is performed by control of a negative pressure supply device and a positive pressure supply device (not shown) provided on the mounter main body side, and control of pressure switching units 84 and 85 provided on mounting head 56 shown in FIGS. 6 and 7, but these may be performed by controlling an electromagnet. There are head-side feeders that perform component supply using magnetism (FIG. 17), and many electronic circuit components are made from magnetic material. In particular for extremely small components, the diameter of the hole for supplying pressure in suction nozzle 80 is small, meaning that stable holding of electronic circuit components is difficult, thus holding and releasing using magnetism is advantageous. In this kind of embodiment, because the head-side feeder performs component supply using magnetism, there is an advantage that only component made of magnetic material, that is appropriate components only, can be supplied.

Hereafter, FIG. 17 is described. For passage-equipped component case 252, as shown in FIG. 17, positioning pins 320 and 322 are engaged with positioning holes 360 and 362 and positioned horizontally with respect to head main body 82. And, by each clamping claw 376 of clamping devices 372 and 374 being engaged with engaging surface surfaces 324 and 326, passage forming body 310 is contacted against head main body 82, such that passage-equipped component case 252 is held positioned vertically with respect to head main body 82. In that state, rotating disk 340 is engaged in concavity 268, and the state is such that the center of a circle defined by the arc of guiding groove 266 matches the rotational axis line of rotating disk 340. Due to this, in accordance with permanent magnets 346 being rotated by the rotation of rotating disk 340, as well as components 294 inside housing chamber 272 being picked up and moved from down to up by permanent magnets 346, a portion of components 294 are fitted into guiding groove 266, and enter into guiding passage 270 from guiding groove 266. However, it is not the case that all of the components 294 moved in accordance with the rotation of permanent magnets 346 can be fitted into guiding groove 266, and components 294 which are moved to near the boundary between guiding groove 266 and guiding passage 270 without being fitted into guiding groove 266 are dropped off by drop-off section 283 and fall into housing chamber 272. Meanwhile, components 294 which entered into guiding passage 270 soon enter into component passage 258, and move to component supply section 316 in a state arranged in a line. Although omitted from the figure, the air inside component passage 258 is sucked by an air suction device to aid the movement of component 294 to component supply section 316.

As is clear from the above descriptions, bulk component arranging device 392 which sorts, arranges in a line, and makes enter into guiding passage 270 components 294 is configured from guiding groove 266 and drop-off section 283, and in the present embodiment, this arranging device 392 configures bulk component indexing device 254 which acts together with the bulk component driving device 338 configured from the above rotating disk 340 and rotating disk driving device 342 to index components 294 to component passage 258 via guiding passage 270. Also, in the present embodiment, as well as passage-equipped component case 252 being able to be separated from bulk component driving device 338, it is attached such that it can be attached/removed to/from head main body 82 by passage-equipped component case attachment device 370, such that exchange is possible, with passage-equipped component case 252 being removed from head main body 82 and a different passage-equipped component case 252 being attached.

In this above embodiment, discarding of components 150 and 152 is performed in S32 and S33 after the mounting of components 150 and 152 has been completed. This is because it is necessary to move mounting head 56b to a component discarding position in order to discard a component, thus it is done to avoid the degradation of mounting operation efficiency by the time required for this movement; however, suction nozzles 80 holding components 150 and 152 to be discarded cannot be used to hold other components. Also, there is a concern that components 150 and 152 held in an abnormal orientation will fall during operation. In order to avoid these disadvantages, discarding components may be performed during the repeated reception and mounting of components 150 and 152. For example, discarding operation may be performed when the quantity of suction nozzles that hold a component in an abnormal orientation is equal to or greater than a preset number (plural number), or when the rotation holding body 68 has rotated a set amount (set rotational angle) or greater after a suction nozzle 80 has held a components 150 or 152 in an abnormal orientation.

It has been assumed in the above description that the suction nozzles 80 held by the rotation holding body 68 are all the same. In the present embodiment, the mounting line 12 includes multiple mounting modules 10, and as mentioned above, the components 150 and 152 to be mounted by one mounting module 10 are basically determined such that all the multiple suction nozzles 80 held by the rotation holding body 68 of one mounting module 10 are the same; however, there are cases in which there are mounting modules 10 for which this assumption is not true. When mounting operation is performed on one circuit board 46 by only one electronic circuit component mounter, in many cases multiple different types of suction nozzles 80 are attached. However, in such cases, in a mounting head that holds multiple suction nozzles 80 as in mounting head 56b, for example, there may be cases in which, even though there is still a tape component 150 to be received and there is an empty suction nozzle 80, the suction nozzle 80 which has been moved to the tape component reception position is not appropriate for the next tape component 150 to be received, thus receiving the component cannot be performed. In such cases, with the empty suction nozzle 80 remaining empty, the reception order may be changed such that the component to be received next is received by another suction nozzle 80, or the empty suction nozzle 80 may receive a different tape component 150 from later in the reception order; alternatively, the empty suction nozzle 80 may receive a bulk component 152. Also, the mounting of components that are already held may be started with the empty suction nozzle 80 remaining empty.

As in the above embodiment, if the mounting of tape components 150 is to be performed first, the loading of circuit board 46 into mounting module 10 and the reception of tape components 150 which take a relatively long time are preferably performed simultaneously. This feature may be adopted separately from the feature "the component reception order is determined such that the number of times the mounting head 56b moves between the printed circuit board holding devices 42 and 44 and the mounter-main-body-side feeders such as tape feeders 48 is as small as possible".

However, if the mounting of tape components 150 and the mounting of bulk components 152 are performed separately in batches, it is preferable that the number of times the mounting head 56b moves between the printed circuit board holding devices 42 and 44 and the tape feeders 48 which are the main-body-side feeders is small, and from this point of view, the mounting of the bulk components 152 may be performed first.

In a case in which mounting of bulk components 152 is performed before mounting of tape components 150, when starting mounting of tape components 150, there are cases in which some of the multiple suction nozzles 80 on rotation holding body 68 are already holding a bulk component 152; in this state, the quantity of tape components 150 that can be received is less than the total quantity of suction nozzles 80 on rotation holding body 68, thus there is a chance that the number of times rotation holding body 68 moves to tape feeders 48 will be increased. However, this situation can be avoided by moving rotation holding body 68 towards the group of tape feeders 48 for the tape components 150 to be received after mounting has been completed of bulk components that are already being held.

Also, the reception order of tape components 150 and bulk components 152 is not limited to the above embodiment, the reception order of tape components 150 and bulk components 152 may be determined such that the number of times head main body 82 (mounting head 56b) is moved between printed circuit board holding devices 42 and 44 and tape feeders 48 by head moving device 58 is as small as possible.

For example, assuming that the number of suction nozzles 80 of mounting head 56b is 12, the number of tape components 150 to be mounted is 25, and the number of bulk components 152 to be mounted is 10, in case (1) where the order of actions is: receiving 12 tape components→mounting→receiving 12 tape components→mounting→receiving 1 tape component→mounting→receiving 10 bulk components→mounting, and case (2) where the order of actions is: receiving 12 tape components→mounting→receiving 1 tape component→mounting→receiving 10 bulk components→mounting→receiving 12 bulk components→mounting, the reception order of the first type tape components and bulk components is different, but the number of times mounting head 56b moves to receive tape components 150 is the same. Also, even if the quantity of received tape components 150 is not the same as the quantity of suction nozzles 80 as in case (3) where the order of actions is: receiving 8 tape components→mounting→receiving 8 tape components→mounting→receiving 9 tape component→mounting→receiving 10 bulk components→mounting; or by having bulk components 152 be received during mounting of tape components 150 as in case (4) where the order of actions is: receiving 8 tape components→mounting and receiving 3 bulk components→mounting→receiving 8 tape components→mounting and receiving 3 bulk components→mounting→receiving 9 tape components→mounting and receiving 4 bulk components→mounting; the number of times mounting head 56b is moved is the same even though bulk components are not received as a batch, and a large difference does not arise in the overall time for mounting operation.

Rather, as in case (4) above for example, if the reception of bulk components and the reception of tape components for which the mounting position is close to the bulk component mounting position are performed together, an effect of improving the efficiency of the mounting operation is obtained.

Also, although in the above embodiment the component supply section 96 of the multiple bulk feeders 90 is selectively moved to a common tape component receiving position by the multiple bulk feeders 90 being moved by feeder moving device 98, an embodiment may be such that, for example, as disclosed in JP-A-2011-206452, each component supply position of the multiple bulk feeders is fixed on the head main body to correspond to each of the multiple revolving positions of the suction nozzles 80.

Also, although in the above embodiment the mounting head provided with multiple suction nozzles 80 includes a rotation holding body 68, other embodiments may be applied to, for example, an electronic circuit component mounter provided with a non-rotating type mounting head such as a mounting head in which multiple suction nozzles are held in a line, and with which reception and mounting of components is performed by suction nozzles selected from those suction nozzles, or an electronic circuit component mounting system including such an electronic circuit component mounter, or an electronic circuit component mounting method using that mounter or mounting system.

The invention claimed is:

1. An electronic circuit component mounting system comprising:
   a mounter main body;
   (a) a circuit substrate conveying and holding device held on the mounter main body that conveys, fixes, and holds a circuit substrate,
   (b) a head main body that is moved with respect to the mounter main body by a head moving device to any position on a movement plane inside the mounter main body,
   (c) at least one head-side feeder held on the head main body that supplies electronic circuit components,
   (d) a mounting device that receives the electronic circuit components from the at least one head-side feeder and mounts the electronic circuit components on the circuit substrate held by the circuit substrate conveying and holding device using multiple component holding tools provided on the head main body,
   (e) a control device that controls the circuit substrate conveying and holding device, the head moving device, the at least one head-side feeder, and the mounting device, and
   (f) a control device that performs control such that, during contact between the component holding tool positioned at a component mounting position and an electronic circuit component of the electronic circuit components, and during contact between the electronic circuit component and the circuit substrate, the component holding tool positioned at a component pickup position of the at least one head-side feeder and an electronic component contact each other, and the electronic circuit component and the at least one head-side feeder contact each other, wherein the head main body includes a pair of clamping devices that respectively include positioning pins that engage a pair of positioning holes on the at least one head-side feeder.

2. The electronic circuit component mounting system according to claim 1, wherein
the component mounting position and the component pickup position for components supplied by the at least one head-side feeder are provided on the head main body at a different position on a moving plane of the head main body inside the mounter main body.

3. The electronic circuit component mounting system according to claim 1 wherein
the mounting device additionally receives a mounter-side electronic circuit component from a mounter-side feeder provided inside the mounter main body and mounts the mounter-side electronic circuit component on the circuit substrate held by the circuit substrate conveying and holding device, and the component holding tool positioned at the component mounting position receives the mounter-side electronic circuit component from the mounter-side feeder.

4. The electronic circuit component mounting system according to claim 3, wherein
the electronic circuit component mounting system is provided with a control device that performs raising/lowering axis bend correction when the component holding tool positioned at the component mounting position mounts the component on the circuit substrate held by the circuit substrate conveying and holding device, or when the component holding tool positioned at the component mounting position receives the mounter-side electronic circuit component from the mounter-side feeder.

5. The electronic circuit component mounting system according to claim 1,
wherein the component holding tool holds or releases the electronic circuit component by controlling electrically a magnetic force.

6. The electronic circuit component mounting system according to claim 5, wherein
the at least one head-side feeder performs component supply using magnetism.

7. The electronic circuit component mounting system according to claim 5,
wherein the at least one head-side feeder includes a permanent magnet the rotates to supply the electronic components to the component pickup position.

8. An electronic circuit component mounting system comprising:
a mounter main body;
(a) a circuit substrate conveying and holding device held on the mounter main body that conveys, fixes, and holds a circuit substrate,
(b) a head main body that is moved with respect to the mounter main body by a head moving device to any position on a movement plane inside the mounter main body,
(c) at least one head-side feeder held on the head main body that supplies electronic circuit components,
(d) a mounting device that receives the electronic circuit components from the at least one head-side feeder and mounts the electronic circuit components on the circuit substrate held by the circuit substrate conveying and holding device using multiple component holding tools provided on the head main body,
(e) a control device that controls the circuit substrate conveying and holding device, the head moving device, the at least one head-side feeder, and the mounting device, and
(f) a control device that performs control such that, during contact between the component holding tool positioned at a component pickup position of an electronic circuit component of the electronic circuit components supplied from the at least one head-side feeder and the electronic circuit component, and during contact between the electronic circuit component and the at least one head-side feeder, the component holding tool positioned at a component mounting position and the electronic circuit component and contact each other and the electronic circuit component and the circuit substrate contact each other,
wherein the head main body includes a pair of clamping devices that respectively include positioning pins that engage a pair of positioning holes on the at least one head-side feeder.

9. An electronic circuit component mounting system comprising:
a mounter main body;
(a) a circuit substrate conveying and holding device held on the mounter main body that conveys, fixes, and holds a circuit substrate,
(b) a head main body that is moved with respect to the mounter main body by a head moving device to any position on a movement plane inside the mounter main body,
(c) at least one head-side feeder held on the head main body that supplies electronic circuit components,
(d) a mounting device that receives the electronic circuit component components from the at least one head-side feeder and mounts the electronic circuit components on the circuit substrate held by the circuit substrate conveying and holding device using multiple component holding tools provided on the head main body,
(e) a control device that controls the circuit substrate conveying and holding device, the head moving device, the at least one head-side feeders feeder, and the mounting device, and
(f) a control device that performs control such that, during contact between the component holding tool positioned at a component mounting position and an electronic circuit component of the electronic circuit components, and during contact between the electronic circuit component and the circuit substrate, the component holding tool positioned at a component pickup position of a component supplied from the at least one head-side feeder and an electronic component contact each other, and the electronic circuit component and the at least one head-side feeder contact each other,
wherein the head main body includes a pair of clamping devices that respectively include clamping claws that engage a pair of engaging surfaces on the at least one head-side feeder.

* * * * *